(12) United States Patent
Treiblmayr (10) Patent No.: US 10,088,746 B2
(45) Date of Patent: Oct. 2, 2018

(54) METHOD AND DEVICE FOR EMBOSSING STRUCTURES

(71) Applicant: EV GROUP E. THALLNER GMBH, St. Florian am Inn (AT)

(72) Inventor: Dominik Treiblmayr, Kirchdorf am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/038,761

(22) PCT Filed: Oct. 22, 2014

(86) PCT No.: PCT/EP2014/072638
§ 371 (c)(1),
(2) Date: May 24, 2016

(87) PCT Pub. No.: WO2015/078637
PCT Pub. Date: Jun. 4, 2015

(65) Prior Publication Data
US 2017/0031242 A1    Feb. 2, 2017

(30) Foreign Application Priority Data
Nov. 29, 2013  (DE) .......... 10 2013 113 241

(51) Int. Cl.
G03F 7/00     (2006.01)
B29C 59/02    (2006.01)

(52) U.S. Cl.
CPC ...... *G03F 7/0002* (2013.01); *B29C 2059/023* (2013.01)

(58) Field of Classification Search
None
See application file for complete search history.

(56) References Cited

U.S. PATENT DOCUMENTS

| 6,916,584 | B2 | 7/2005 | Sreenivasan et al. | |
|---|---|---|---|---|
| 2004/0192041 | A1 | 9/2004 | Jeong et al. | 438/689 |
| 2005/0276919 | A1 | 12/2005 | Truskett et al. | 427/230 |
| 2006/0121728 | A1 | 6/2006 | McMackin et al. | 438/637 |
| 2007/0228608 | A1 | 10/2007 | Shackleton et al. | 264/319 |

OTHER PUBLICATIONS

International Search Report from corresponding International Patent Application No. PCT/EP2014/072638, dated Feb. 6, 2015.

*Primary Examiner* — Joshua D Zimmerman
(74) *Attorney, Agent, or Firm* — Kusner & Jaffe

(57) ABSTRACT

A method for embossing at least one microstructure or nanostructure with an embossing die that has at least one embossing structure with the following steps, in particular the following sequence: aligning the embossing structure of the embossing die relative to a metering device, metering an embossing material in the embossing structure by means of the metering device, at least partial hardening of the embossing material and embossing of the embossing material, characterized in that the embossing structures point in a gravitational direction (G) at least in the case of the metering. In addition, the invention relates to a corresponding device.

11 Claims, 3 Drawing Sheets

METHOD AND DEVICE FOR EMBOSSING STRUCTURES

FIELD OF THE INVENTION

The invention relates to a method and device for embossing structures.

BACKGROUND OF THE INVENTION

The production of structures in the micrometer and/or nanometer range is carried out to an increasing extent using imprint lithography. In recent years, imprint lithography has always been able to hold its own compared to photolithography. The merits of imprint lithography primarily lie in the possibility of the production of structures in the nanometer range, whose production would not be at all feasible by means of photolithography or would be extremely expensive. Now, patterns in the nanometer and/or micrometer range can be produced with high precision and accuracy in a mass process on the surfaces of substrates. Although the merits of imprint lithography lie primarily in the production of structures in the nanometer range, there is also a very large area of application in the micrometer range for the imprint technologies, most particularly in the lens-embossing technique.

The lens-embossing techniques can be used in embossing techniques for the production of so-called monolithic lens wafers. The production process is called monolithic lens molding (MLM). With this technique, several lenses are produced as part of one and the same substrate. The lenses are not separated from one another and therefore also are not necessarily dependent upon a carrier substrate, although a connection to a carrier substrate or any other second substrate can be produced.

In another embossing technique, the lenses are embossed at the same time, but are not connected to one another by means of the embossing material. For quick and efficient further processing, this embossing is carried out in most cases on a carrier substrate. Drops of the embossing material, in most cases by a dispensing system that moves relative to the rigid carrier substrate, are deposited on the carrier substrate. Then, an approximate relative movement between the embossing die and the carrier substrate occurs. Preferably, only the die is brought closer relative to the static carrier substrate. In this case, each individual lens is to be as symmetric as possible. This is primarily then ensured when the drops of the embossing material were positioned exactly below the embossing structures. In addition, during the embossing process, it must be ensured that the embossing die (and thus the embossing structures) does not move relative to the drops of embossing material in an X-direction and/or a Y-direction during the approach in the Z-direction. The drops of the embossing material can be pressed and formed partially to the side during the embossing process, but in general, they no longer leave their position on the carrier substrate since the prevailing adhesion between carrier substrate and embossing material is too great for this purpose.

In a third embossing technique, a so-called step-and-repeat embossing die is used. The step-and-repeat embossing die is in this case smaller than the substrate, on which the lenses are to be embossed. In general, the step-and-repeat embossing die even has only one single lens shape and can thus emboss, if any, only one individual lens for each embossing step. In this embossing technique, preferably in turn drops of the embossing material are distributed on a substrate. Then, the step-and-repeat embossing die starts each drop individually and performs the embossing. In special cases, the deposition of a full-surface layer on the embossing material is also conceivable, which embossing material is then structured by a step-and-repeat embossing die. Some step-and-repeat embossing dies have several lens shapes of the same or different shape and thus are between the full-surface and the pure step-and-repeat embossing dies. Correspondingly, they can simultaneously emboss several lenses for each embossing step.

The quality of an embossed product, for example a lens wafer, or corresponding single lenses on a carrier substrate, therefore very greatly depends on the interaction between the die and the embossing material. Thus, during the dispensing of the embossing material and/or the embossing process, defects such as gas bubbles, differences in thickness along the surface, unevenness in density, runny or asymmetric embossing material, etc., can develop.

Because of the highly-viscous embossing material, gas bubbles are not specifically produced during the embossing process in most cases but rather are already located in the embossing material, for example by a false filling of the dispensing system. Nevertheless, such gas bubbles can sometimes even develop during the dispensing itself.

The differences in thickness along one surface are in most cases a result of an existing wedge error and can be avoided to a very large extent by a correct positioning between embossing die and carrier substrate.

Some unevenness in density is likely of a chemical nature and caused to a lesser extent by the dispensing system. Very possibly, however, the cross-linking of a polymer at various sites can occur at various levels of strength during a hardening process and can lead to a corresponding unevenness in density.

Asymmetric embossing materials can primarily occur in a dispensing of drops. In this case, the embossing material is distributed in single drops over a surface and is not completely symmetric to the embossing structures deforming them, so that during or after the embossing, an asymmetric single lens is produced.

One of the greatest problems with the current embossing technology consists primarily in the incomplete distribution or filling of the embossing structures of the embossing die by the embossing material. During the embossing process, the die presses the embossing material radially outward. At the same time, the embossing structures are filled with the embossing material. Ambient gases can be enclosed between the embossing material and the surface of the embossing structures of the embossing die by this process. These ambient gases produce corresponding bubbles and thus destroy the homogeneity of the material. This can have fatal effects primarily in the case of optical products such as lenses. Lenses with such effects would have lens defects, in particular chromatic and spherical aberrations. It would be conceivable to allow a corresponding embossing process to take place in a vacuum. To this end, the corresponding chamber has to be evacuated before each embossing process. After successful embossing, the chamber would again be ventilated. These processes are correspondingly time-intensive and therefore very expensive.

Another problem, which primarily occurs in the dispensing of drops of embossing material for the production of single lenses distributed on a carrier substrate, is the symmetry of individual lenses. A poorly-positioned drop of embossing material on the carrier substrate and/or a poor approach of the embossing die and therefore the embossing structures, relative to the drops of embossing material, lead to asymmetric lens shapes.

The flowing of the embossing material, which can be attributed in particular to the adhesion property between the embossing material and the corresponding surface, represents another problem.

It is therefore the object of this invention to solve one or more of the above-mentioned technical problems with a method and/or a device according to the subsequent description.

This object is achieved with the features of the independent claim(s). Advantageous further developments of the invention are indicated in the subclaims. All combinations that include at least two of the features indicated in the specification, the claims and/or the figures also fall within the scope of the invention. In the indicated ranges of values, values as boundary values that lie within the above-mentioned limits are also to be considered as disclosed and can be claimed in any combination.

SUMMARY OF THE INVENTION

The invention is based on the idea of solving the above-mentioned technical problems by dispensing an embossing material in embossing structures against the force of gravity, in particular by aligning the dispensing direction of a metering device against the force of gravity, i.e., against a gravitational direction G and/or by orienting embossing structures, in particular an axis of symmetry of the respective embossing structure, parallel to the force of gravity and/or pointing (i.e., facing) in the gravitational direction G.

The invention therefore in particular deals with a method and a unit for avoiding gas inclusions between the surface of the embossing structure of the embossing die and the embossing material as well as a method for continuous and/or controlled hardening of the embossing material.

In addition, the invention deals with a method and a unit that ensure that the embossing material performs self-assembly into a preset form. This self-assembly is a direct result of several physical effects.

Another aspect according to the invention is the prevention or at least the suppression of the lateral flowing of the embossing material.

The invention has the advantages of a self-assembly of the embossing material in the corresponding embossing structure, a savings of material by a targeted and exactly calculated dispensing/metering, a symmetrification and uniform distribution of the embossing material in the embossing structures, a locally limited edge layer hardening of the embossing material, which does not inhibit—or prevent—a deformation of the edge layer against set embossing material.

In addition, a flowing of the embossing material in the lateral direction by gravitation is prevented with the dispensing method according to the invention. The gravitation according to the invention provides that a convex embossing material surface is designed in the direction of the carrier substrate, which prevents a lateral spilling of the embossing material. In addition, because of the convex embossing material surface, a point contact of the embossing material with the substrate surface is made possible. Because of another approach of the embossing die in the direction of the carrier substrate, the contact surface of the embossing material surface is enlarged continuously with the carrier substrate, starting from the contact point, and thus prevents inadvertent gas inclusions in the simplest manner.

The invention describes in particular a method and a unit for embossing micrometer-size and/or nanometer-size structures. One idea according to the invention is comprised of an efficient, simplified, inexpensive method for locally limited and defect-free distribution of an embossing material. The dispensing of the embossing material in the embossing structures of the embossing die in this case is carried out according to the invention against the force of gravity. The filling of the embossing structures of the embossing die is not only made possible but rather also supported by the adhesive forces between the surface of the embossing structure and the embossing material. The adhesion, the curvature of the embossing structures, as well as the pressure generated by a nozzle result in tangential forces on the embossing material, which results in a wetting of the embossing structure surface. During the wetting process, any gas that exists in the environment is pushed ahead of the wave of embossing material. A possible formation of undesired gas inclusions therefore does not occur. In addition, the embodiment and method according to the invention prevent by gravitation a flowing of the embossing material in the lateral direction, i.e., along the embossing structure surface.

According to another aspect according to the invention, the invention describes in particular a unit for dispensing an embossing material in an embossing structure of an embossing die. The embossing structures of the embossing die are located during the filling above a substrate, on which the embossing process is to be performed. The unit according to the invention therefore is comprised at least of a sample holder, an embossing die, as well as a dispensing device, which can dispense/meter embossing material against the force of gravity.

In the following sections, the two basic kinds of dies for embossing lithography are to be presented.

In imprint technology, a distinction is made between two kinds of embossing dies, the hard dies and the soft dies. Any die process can theoretically be performed with a hard die or a soft die. There are, however, several technical and financial reasons to use the hard die itself only as a so-called master die and to mold a soft die from this master die, whenever necessary, which soft die then is used as an actual structural die. The hard die is thus a negative of the soft die. The hard die is required only for the production of several soft dies. Soft dies can be distinguished by different chemical, physical and technical parameters of hard dies. A differentiation based on the elasticity behavior would be conceivable. Soft dies have a deformation behavior predominantly based on entropy elasticity, and hard dies have a deformation behavior predominantly based on energy elasticity. In addition, the two kinds of dies can be distinguished by, for example, their hardness. Hardness is the resistance that a material puts up against a penetrating body. Since hard dies are predominantly comprised of metals or ceramics, they have correspondingly high hardness values. There are different possibilities for indicating the hardness of a solid body. A very commonly used method is the indication of hardness according to Vickers. Hard dies according to the invention preferably have a Vickers hardness of more than 500 HV.

Hard dies specifically have the advantage that they can be manufactured directly by suitable processes such as electron beam lithography or laser beam lithography from a component made of a material with high strength and a high degree of rigidity. Such hard dies have a very high level of hardness and are thus more or less wear-resistant. The high level of strength and wear resistance, however, are primarily accompanied by high costs, which are necessary with respect to manufacturing a hard die. Even though the hard die can be used for hundreds of embossing steps, even it will experience significant wear over time. In addition, the demolding of the hard die from the embossing material is technically difficult. Hard dies have a relatively high flexing resistance. They are not especially readily deformable, i.e., in the ideal case, they have to be lifted in the normal direction. In the demolding of the hard die after the embossing process, in this case it can regularly result in a destruction of the embossed nanostructures and/or microstructures, since the hard die has a very high degree of rigidity and therefore can destroy the microstructures and/or nanostructures of the just-molded embossing material. In addition, substrates can have defects that can subsequently lead to damage or destruction of the hard die. If the hard die is only used as a master die, however, the molding process of the soft die from the master die is very readily controllable and is associated with very little wear of the master die.

Soft dies can be manufactured very simply by replication processes from the master die (hard die). In this case, the master die represents the negative that corresponds to the soft die. The soft dies are thus embossed on the master die, subsequently demolded, and then are used as structural dies for embossing the die structures on a substrate. Soft dies can be removed more simply, gently and less problematically from the embossing material than hard dies. In addition, any number of soft dies can be molded by a master die. After a soft die has undergone a certain wear and tear, the soft die is discarded and a new die is formed from the master die.

For the embodiments according to the invention, hard dies are preferably used.

The sample holder is preferably a vacuum sample holder. The use of an electrostatic sample holder, a sample holder with magnetic or electrical attachment, or a sample holder with a changeable adhesion property or with a corresponding mechanical clamping would also be conceivable.

On its embossing side, the embossing die has in particular several embossing structures that are preferably distributed over the entire embossing surface of the embossing side and are in particular arranged in regular fashion. In this case, for example, these can be, for example, concave lens shapes that are used as negatives of the convex lenses to be embossed in a corresponding manner. The diameter of the lenses is especially preferably large in comparison to the depth of the lens. The ratio of the diameter to the depth of the lens shapes is in particular larger than 1, preferably larger than 10, more preferably larger than 20, most preferably larger than 50, and with utmost preference larger than 100. A correspondingly large ratio ensures the continuous lateral inflow and freedom from bubbles of the embossing material that is unimpeded according to the invention. As an alternative, a structure, especially a lens shape in which the diameter is smaller than the depth, is conceivable. The ratio of the depth to the diameter of the lens shapes is then in particular larger than 1, preferably larger than 10, more preferably larger than 20, most preferably larger than 50, and with utmost preference larger than 100.

The embossing material is hardened according to the invention in particular by chemical and/or physical processes. In particular, the embossing material is hardened either by electromagnetic radiation and/or by temperature.

Preferably, the hardening by electromagnetic radiation is carried out with special preference by UV radiation. In this case, the embossing die is preferably transparent to the necessary electromagnetic radiation, when the embossing material is to be hardened from the embossing die side. This is the case according to the invention in particular with gradual hardening of the embossing material.

Behind the embossing die (i.e., on the side facing away from the embossing structures), a corresponding radiation source is preferably arranged. The embossing die is therefore in particular transparent in a wavelength range of between 5,000 nm and 10 nm, preferably between 1,000 nm and 100 nm, more preferably between 700 nm and 200 nm, and most preferably between 500 nm and 300 nm. The optical transparency of the embossing die is in this case greater than 0%, preferably greater than 20%, more preferably greater than 50%, most preferably greater than 80%, and with utmost preference greater than 95%.

If the embossing material is to be thermally hardened by the embossing die, the embossing die primarily has very high heat conductivity in order to transport the heat on the back side of the die as quickly as possible to the embossing material. In this case, the heat conductivity of the embossing die is in particular greater than 0.1 W/(m*K), preferably greater than 1 W/(m*K), preferably greater than 10 W/(m*K), most preferably greater than 100 W/(m*K), and with utmost preference greater than 1,000 W/(m*K).

In addition, the embossing die should have a correspondingly low heat capacity for as little thermal inertia as possible. The specific heat capacities should be less than 10 kJ/(kg*K), preferably less than 1 kJ/(kg*K), more preferably less than 0.1 kJ/(kg*K), most preferably less than 0.01 kJ/(kg*K), and with utmost preference less than 0.001 kJ/(kg*K). As a result, temperature changes of the heat source can be relayed as quickly as possible to the embossing material.

The hardening temperature of the embossing material is in particular greater than 25° C., preferably greater than 100° C., more preferably greater than 250° C., and with utmost preference greater than 500° C. The invention can be carried out for special applications at hardening temperatures of more than 700° C., preferably more than 800° C., more preferably more than 900° C., and most preferably around 1,000° C., in particular with a use of embossing materials, in which a sintering process is performed.

A hardening of the embossing materials via a radiation source in or on the sample holder is also conceivable according to the invention. All features mentioned for the embossing die accordingly apply analogously for the sample holder, in particular as an alternative or additional radiation source. An additional source in the sample holder can primarily accelerate and promote the complete hardening of the embossing materials at the end of any process according to the invention. A special efficiency and homogeneity, in particular, however, a flexibility in the case of the control of the hardening process, is achieved primarily by a simultaneous two-sided hardening.

Another advantage of the metering/dispensing of the embossing material according to the invention against gravitation (force of gravity acting on the embossing material during metering/dispensing) includes that, in any of the two above-mentioned methods according to the invention, gravitation ensures that the embossing material does not run in the lateral direction.

Another aspect according to the invention for the dispensing of the embossing material against gravitation is an adhesive force between the embossing material and the embossing structure surface, which, in particular by material selection and/or surface treatment, is set greater than the force of weight or the weight of the embossing material. The ratio between the force of weight and the adhesive force is in this case smaller than 1, preferably smaller than 0.1, more preferably smaller than 0.01, most preferably smaller than 0.001, and with utmost preference smaller than 0.0001.

In this case, it is noticed in particular that there is as little adhesion as possible so that in the last process step, the demolding step, as simple a demolding of the embossing die as possible can be carried out. The adhesive energy surface density, adhesive force for short, is in particular less than 1 J/m2, more preferably less than 0.1 J/m2, more preferably less than 0.01 J/m2, most preferably less than 0.001 J/m2, and with utmost preference less than 0.0001 J/m2.

The viscosity of the embossing material is preferably very low, so that a correspondingly simple and fast distribution of the embossing material in the lens shape can be carried out. The viscosity is in particular less than 100,000 mPas, preferably less than 1,000 mPas, more preferably less than 5 mPas, and most preferably less than 1 mPas.

The dispensed volumes of the embossing material are in particular larger than 0.0001 μl, preferably larger than 0.001 μl, most preferably larger than 0.1 μl, most preferably larger than 10 μl, and with utmost preference larger than 500 μl.

According to the invention, it is conceivable in particular that the device according to the invention and the method for the production of a monolithic lens wafer according to the invention are used by enough embossing material being deposited that the embossing materials in the individual lens shapes are laterally combined with one another even before the embossing on the substrate. In particular by metering the embossing material for each lens shape so that no contact of the embossing materials among one another occurs, the embodiment according to the invention for simultaneous embossing of single lenses can be used on a substrate. If an embossing die that is smaller than the substrate on which the lenses are to be embossed is used according to the invention, the process according to the invention is correspondingly repeated often in order to provide the entire substrate with lenses. Accordingly, the embossing technique would be referred to as a step-and-repeat embossing technique.

The embodiment according to the invention can be applied in particular to the above-described embossing techniques.

The unit according to the invention can preferably be installed in a process chamber which can be hermetically sealed from the environment. Thus, an evacuation of the process chamber and/or a ventilation of the process chamber is made possible with any gas or gas mixture. In this case, the process chamber can be evacuated at pressures of less than 1 bar, preferably less than $10^{-3}$ mbar, more preferably less than $10^{-5}$ mbar, and most preferably less than $10^{-8}$ mbar. The use of a vacuum primarily has the advantage that as a result, the undesired gas inclusion can be completely suppressed or at least improved, since even before (preferred embodiment) and/or during and/or after the embossing material is deposited, any and all kinds of gas are removed from the process chamber.

The process chamber can be flushed according to the invention in particular with any gas or gas mixture. This is primarily then advantageous when the embossing is not to take place under vacuum. High volatility of the embossing material at low ambient pressure would be a possible reason—but not the only reason—for the elimination of a vacuum. The slight volatility that is characterized by a high vapor pressure can contribute decisively to the contamination of the process chamber. The gas that is used should then have as little interaction with the embossing material as possible. Flushing with an inert gas, which does not interact with the embossing material, would be especially preferred. In particular, the use of Argon and/or
Helium and/or
Carbon dioxide and/or
Carbon monoxide and/or
Nitrogen and/or
Ammonia and/or
Hydrogen would be conceivable.

When embossing materials are used that are to be influenced by a gas, preferably correspondingly reactive gases are used. In quite special embodiments, it is conceivable that the process chamber is exposed to an overpressure. In this case, the pressure in the process chamber is greater than 1 bar, preferably greater than 2 bar, more preferably greater than 5 bar, most preferably greater than 10 bar, and most preferably greater than 20 bar. The overpressure is preferably produced with one of the above-mentioned gases or a corresponding gas mixture. However, the use of oxygen or air as a gas mixture is also conceivable.

If device features that exist and/or are in the subsequent description of the figures are disclosed, the latter are also to be considered disclosed as method features and vice versa.

Additional features and embodiments of the invention follow from the claims as well as the subsequent description of the figures in the drawing.

In the figures, parts that are the same or that act the same are identified with consistent reference numbers, whereby the dimensional ratios for illustration are not true-to-scale.

Figure 1:
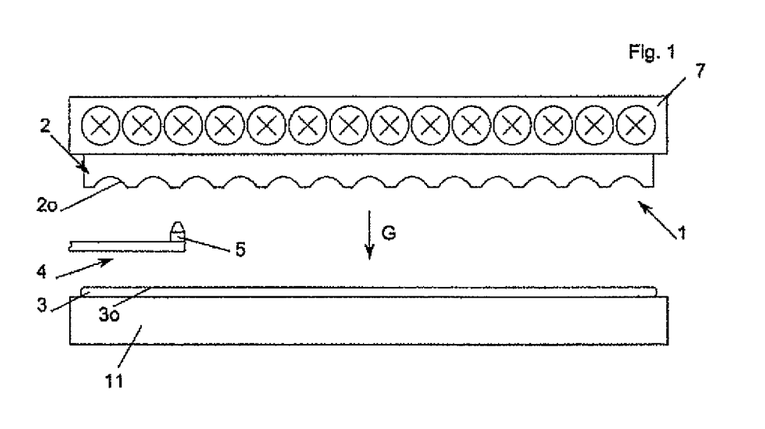
FIG. 1 a diagrammatic cross-sectional depiction of an embodiment of a unit according to the invention with carrier substrate, embossing die, and a dispensing device for dispensing/metering against gravitation, FIG. 2a a diagrammatic cross-sectional depiction of a first step of a first embodiment of the method according to the invention with centric metering, FIG. 2b a diagrammatic cross-sectional depiction of a second step of the first embodiment of the method according to the invention, FIG. 2c a diagrammatic cross-sectional depiction of a third step of the first embodiment of the method according to the invention, FIG. 2d a diagrammatic cross-sectional depiction of a fourth step of the first embodiment of the method according to the invention, FIG. 2e a diagrammatic cross-sectional depiction of a fifth step of the first embodiment of the method according to the invention, FIG. 2f a diagrammatic cross-sectional depiction of an end product of the first embodiment of the method according to the invention, FIG. 3a a diagrammatic cross-sectional depiction of a first step of a second embodiment of the method, according to the invention, of non-centric metering, FIG. 3b a diagrammatic cross-sectional depiction of a second step of the second embodiment of the method according to the invention, FIG. 3c a diagrammatic cross-sectional depiction of a third step of the second embodiment of the method according to the invention, FIG. 3d a diagrammatic cross-sectional depiction of a fourth step of the second embodiment of the method according to the invention, FIG. 3e a diagrammatic cross-sectional depiction of a fifth step of the second embodiment of the method according to the invention, and FIG. 3f a diagrammatic cross-sectional depiction of an end product of the first embodiment of the method according to the invention.

FIG. 1 shows a diagrammatic depiction of an embodiment of a device according to the invention, whereby a housing and holding devices such as robots or aligning devices for alignment or a control device for control of the functions and features that are described according to the invention are not depicted.

DETAILED DESCRIPTION OF THE INVENTION

The following three components can be moved and oriented relative to one another:

- An embossing die 1 with embossing structures 2, provided in particular on a rear side 1r with a radiation source 7, whereby the embossing die 1 is arranged and/or can be arranged with its embossing structures 2 pointing in a gravitational direction G,
- A carrier substrate 3 that can be attached to a sample holder 11 or chuck, and
- A metering device 4 with a nozzle 5, which can be arranged between the embossing die 1 and the carrier substrate 3, whereby the metering device 4 can implement metering of an embossing material 6 against the gravitational direction G.

FIGS. 2a-2f show a first dispensing method with centric dispensing/metering of the embossing material 6 in the example of a host of embossing structures 2 of the embossing die 1 as well as an embossing of the metered embossing material 6 to form a lens 9 that is in particular hardened. Centric means that the metering is done along an axis of symmetry of each embossing structure 6.

A decisive advantage of a direct dispensing or metering of the embossing material 6 in the embossing structures 2 instead of a dispensing of a drop of embossing material on a carrier substrate 3 includes the self-assembly of the embossing material 6 in the embossing structure 2. In this respect, a symmetric distribution of the embossing material 6 produced by gravitation is achieved relative to the embossing structure 2. It is thus ensured that a symmetric distribution of the embossing material 6 is present, before the embossing material 6 is brought into contact with the carrier substrate 3 (i.e., before embossing).

This self-assembly is a result of the attempt to produce a balance of forces between the surface forces that exist between the phase interfaces.

Figure 2A:
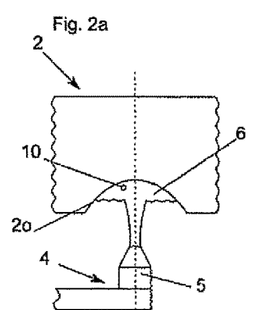

In a first process step according to FIG. 2a, the nozzle 5 is positioned centrically with respect to the embossing structure 2 and is oriented against the gravitational direction G. As a result, the dispensing of the embossing material 6 is also carried out centrically in the respective embossing structure 2. A symmetric, in particular radially symmetric, filling of the concave embossing structure 2 is also carried out by the centric dispensing. In this connection, it can be noted that the possibility of including gas bubbles 10 exists because of this dispensing method. The amount of all gas bubbles 10 in several lenses 9 on the carrier substrate 3 can be very low. In addition, the gas bubbles 10 can migrate until the hardening of the embossing material 6 is completed. Because of the fact that the gas bubble 10 has a lower density than the embossing material 6, a movement of the gas bubble 10 against gravitation is carried out, i.e., to an embossing structure surface 2o of the embossing structure 2, i.e., on a surface 9o of the lens 9.

The diffusion speed of the gas bubble 10 in the embossing material 6 against the gravitational direction G depends on the rheological conditions. Thus, the movement of the gas bubble 10 in the embossing material 6 strongly depends on the viscosity of the embossing material 10. It can therefore definitely occur that the gas bubble 10 does not reach the embossing structure surface 2o before a complete hardening of the embossing material 6 is carried out.

Figure 2B:
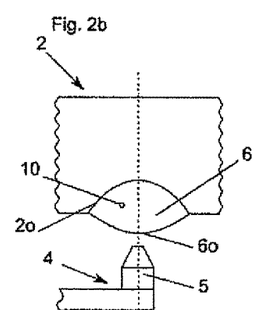

After the metering of the embossing material 6 in the respective embossing structure 2, a convex embossing material surface 6o is set by gravitational force, acting on the embossing material 6, in a second process step according to FIG. 2b. The embossing structures 2 are filled in a sequential manner until all embossing structures 2 are filled with a specific amount of embossing material 6.

Figure 2C:
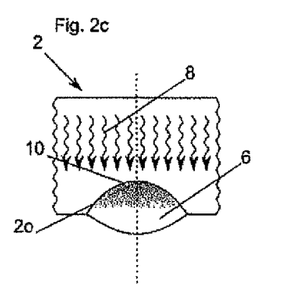

In a third process step according to FIG. 2c, an in particular gradual hardening of the embossing material 6 from the rear side 1r of the embossing die 1 is carried out according to another, in particular independent, aspect according to the invention. To this end, the embossing die 1 is transparent to an electromagnetic radiation 8 from the radiation source 7. In an especially preferred embodiment, the gradual hardening is stopped after the embossing material 6 was hardened at least along the embossing structure surface 2o. Each of the lenses 9 on a lens surface 9o is hardened by the gradual hardening, while a lens base 9b that is further away from the radiation source 7 is still viscous and deformable; i.e., it can be deformed and embossed with the carrier substrate 3.

Figure 2D:
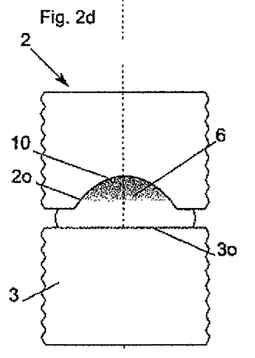

In a fourth process step according to the invention in accordance with FIG. 2d, the embossing is done by a relative approach between the embossing die 1 and a carrier substrate 3. In this case, the embossing material 6 of each lens 9, which material is still viscous toward the carrier substrate surface 30o, is simultaneously deformed.

Figure 2E:
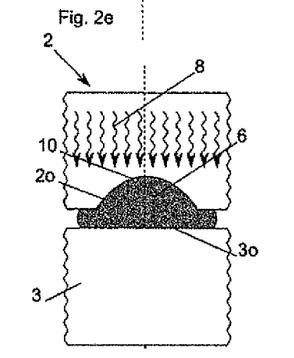

In a fifth process step according to FIG. 2e, a complete hardening of the embossing material 6 and thus the finishing of the lenses 9 is carried out.

Figure 2F:
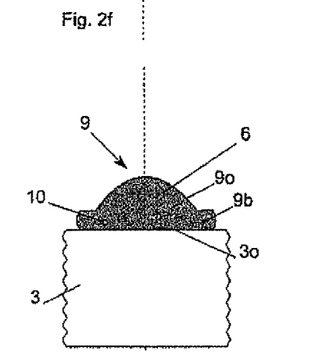

In a last process step, ultimately the simultaneous demolding of the embossing die 1 from the hardened embossing material 6, i.e., the lenses 9, is carried out.

Figure 3A:
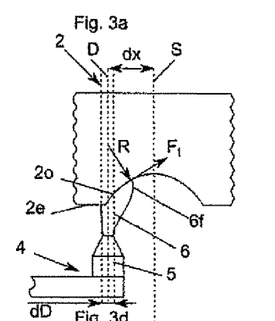
Figure 3B:
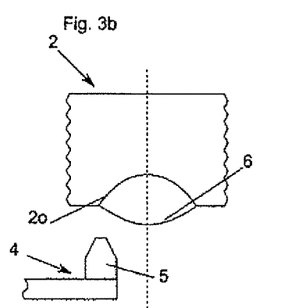
Figure 3C:
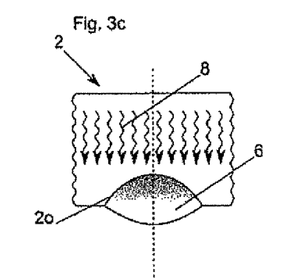
Figure 3D:
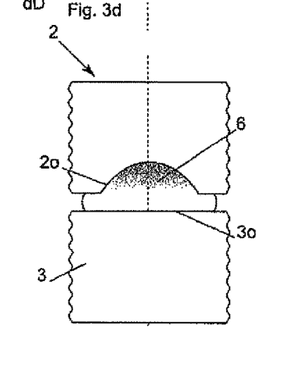
Figure 3E:
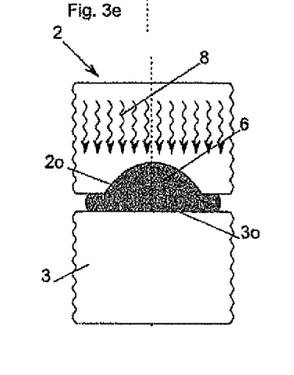
Figure 3F:
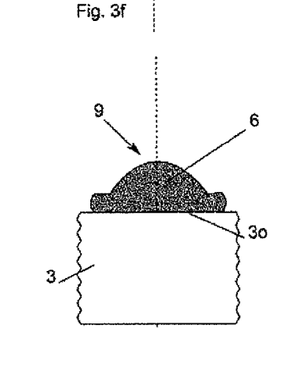

According to a special, in particular independent, embodiment of the dispensing method according to the invention, the dispensing of the embossing material 6 is carried out according to FIGS. 3a-3b in an asymmetric manner to the embossing structure 2. An inclusion of gas bubbles is reduced or prevented by the embodiment according to the invention. The embossing material 6 is dispensed in a dispensing direction D that is in particular parallel and directed opposite to the gravitational direction G, which dispensing direction D is offset by a distance dx to the axis of symmetry S. The ratio between the distance dx and half of the lens diameter, the lens radius, is in this case greater than or equal to 0, preferably greater than 0.1, preferably greater than 0.4, more preferably greater than 0.6, and most preferably between 0.8 and 1.0. Some frequently used absolute values for the distance dx are also disclosed. The distance dx is in this case greater than 0, preferably greater than 10 μm, more preferably greater than 100 μm, most preferably greater than 1,000 μm, and with utmost preference greater than 5 mm. The embodiment is in particular independent of the gravitational direction G.

A tangential force Ft, which draws the embossing material 6 into the embossing structure 2 and thus fills it symmetrically, is produced by the radius of curvature R of the embossing structure surface 2o. The tangential force Ft is preferably a result of the compressive force, with whose help the embossing material 6 exits from the nozzle 5, and/or the capillary force, which is produced by the curvature R of the embossing structure 2. The capillary force is primarily a result of the pressure difference of the gas within the embossing structure 2 and outside of the embossing structure 2. The pressure difference is produced primarily by the different evaporation pressure of the embossing material 6 on a curved section of the embossing structure surface 2o with a radius of curvature R and on a flat section 2e of the embossing die 1. According to the Kelvin equation, the saturation vapor pressure on the concave curved section is less than on the flat section. Accordingly, a slightly lower vapor pressure than on the flat outside surface prevails in the interior of the embossing structure 2.

The additional process steps in FIGS. 3b-3f are carried out analogously to the process steps of FIGS. 2b-2f, but without the production of gas bubbles 10. The prevention of the formation of gas bubbles 10 is primarily a result of the non-centric dispensing according to FIG. 3a. As a result, the embossing material front 6f continuously moves from one side of the embossing structure 2 along the curved section of the embossing structure surface 2o to the corresponding opposite side. Because of this dispensing method of the embossing material 6, only a very small area dD around the dispensing axis D is wetted with the embossing material 6 and allows the embossing material front 6f to take up the correct position continuously and by self-assembly. The small range of values dD is depicted in the drawings as the characteristic length of a surface section. In the case of a circular surface, dD represents the diameter, in the case of a quadrangular surface, the side, and in the case of a rectangular surface, the mean of two sides that are perpendicular to one another. The characteristic length is greater than 0 μm, more preferably greater than 10 μm, more preferably greater than 100 μm, most preferably greater than 1,000 μm, and with utmost preference greater than 5 mm.

The exact orientation of the metering device 4 on one edge of the embossing structures 6, i.e., in the transition between the curved sections of the embossing structures 6 and the flat section 2e of the embossing die 1, is significantly simpler and more exact than the centric orientation.

The self-assembly process according to the invention relative to the symmetrification produced by the metering carried out against the gravitational direction G operates in the two embodiments of the method according to the invention.

REFERENCE SYMBOL LIST

1 Embossing die
1r Rear side
2 Embossing structure
2o Embossing structure surface
2e Flat section
3 Carrier substrate
3o Carrier substrate surface
4 Metering device
5 Nozzle
6 Embossing material
6f Embossing material front
7 Radiation source
8 Electromagnetic radiation
9 Lens
9o Lens surface
9b Lens base
10 Gas bubbles
11 Sample holder D Dispensing direction
dx Distance
S Axis of symmetry
R Radius of curvature
Ft Tangential force
G Gravitational direction Having described the invention, the following is claimed:

1. A method for embossing a lens having at least one microstructure or nanostructure on a carrier substrate, using an embossing die that has at least one embossing structure, each embossing structure having an axis of symmetry and a surface defining a recess for receiving embossing material, said method for embossing comprising:

positioning a metering device relative to an embossing structure of the embossing die such that the metering device dispenses embossing material in a dispensing direction that is parallel to and offset from the axis of symmetry of the embossing structure;

metering the embossing material onto the embossing structure such that all of the embossing material received by the embossing structure is dispensed by the metering device when the dispensing direction is offset from the axis of symmetry of the embossing structure, wherein during the metering the embossing structure faces a carrier substrate in a direction of gravitational forces acting on the metered embossing material to form a convex embossing material surface in a direction facing the carrier substrate;

at least partially hardening the embossing material; and embossing the embossing material, said embossing including:

contacting the embossing material with the carrier substrate at a contact point of the embossing material surface by relative movement of the embossing die toward the carrier substrate, and enlarging a contact surface of the embossing material surface by additional relative movement of the embossing die toward the carrier substrate.

2. The method according to claim 1, wherein the embossing material is partially hardened before the embossing and then completely hardened.

3. The method according to claim 1, wherein the embossing material is metered onto the embossing structure using a nozzle of the metering device.

4. The method according to claim 1, wherein the step of at least partially hardening the embossing material includes hardening from a rear side of the embossing structure.

5. The method according to claim 1, wherein the step of at least partially hardening the embossing material includes hardening by electromagnetic radiation.

6. The method according to claim 1, wherein the step of at least partially hardening the embossing material includes thermal hardening of the embossing material.

7. The method according to claim 1, wherein said offset of the dispensing direction from the axis of symmetry of the embossing structure is selected such that a ratio between (i) a distance of said offset and (ii) a lens radius of the lens is between 0.8 and 1.0.

8. The method according to claim 1, wherein said offset of the dispensing direction from the axis of symmetry of the embossing structure is a distance greater than 5 mm.

9. A method for embossing a plurality of lenses having at least one microstructure or nanostructure on a carrier substrate, using an embossing die that has a plurality of embossing structures, each embossing structure having an axis of symmetry and a surface defining a recess for receiving embossing material, said method for embossing comprising:

a) positioning a metering device relative to an embossing structure of the embossing die such that the metering device dispenses embossing material in a dispensing direction that is parallel to and offset from the axis of symmetry of the embossing structure;

b) metering the embossing material onto the embossing structure such that all of the embossing material received by the embossing structure is dispensed by the metering device when the dispensing direction is offset from the axis of symmetry of the embossing structure, wherein during the metering the embossing structure faces a carrier substrate in a direction of gravitational forces acting on the metered embossing material to form a convex embossing material surface in a direction facing the carrier substrate;

c) sequentially repeating steps a) and b) to fill each of the embossing structures of the embossing die with embossing material;

d) at least partially hardening the embossing material received by the plurality of embossing structures; and e) embossing the embossing material received by the plurality of embossing structures, said embossing including:

contacting the embossing material received by the plurality of embossing structures with the carrier substrate at a contact point of the embossing material surface of each embossing structure by relative movement of the embossing die toward the carrier substrate, and enlarging a contact surface of the embossing material surface of each embossing structure by additional relative movement of the embossing die toward the carrier substrate.

10. The method according to claim 9, wherein said offset of the dispensing direction from the axis of symmetry of the embossing structure is selected such that a ratio between (i) a distance of said offset and (ii) a lens radius of the lens is between 0.8 and 1.0.

11. The method according to claim 9, wherein said offset of the dispensing direction from the axis of symmetry of the embossing structure is a distance greater than 5 mm.

* * * * *